United States Patent
Morita et al.

(10) Patent No.: US 10,366,886 B2
(45) Date of Patent: Jul. 30, 2019

(54) PATTERN FORMING METHOD, SELF-ORGANIZATION MATERIAL, AND METHOD OF MANUFACTURING SEMICONDUCTOR APPARATUS

(71) Applicant: Toshiba Memory Corporation, Tokyo (JP)

(72) Inventors: Seiji Morita, Shinagawa Tokyo (JP); Masahiro Kanno, Yokohama Kanagawa (JP); Yusuke Kasahara, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/444,505

(22) Filed: Feb. 28, 2017

(65) Prior Publication Data

US 2018/0076019 A1 Mar. 15, 2018

(30) Foreign Application Priority Data

Sep. 15, 2016 (JP) ................. 2016-180778

(51) Int. Cl.
| | | |
|---|---|---|
| H01L 21/027 | (2006.01) | |
| C09D 5/00 | (2006.01) | |
| C08F 293/00 | (2006.01) | |
| C09D 153/00 | (2006.01) | |
| H01L 21/02 | (2006.01) | |
| H01L 21/3105 | (2006.01) | |
| H01L 21/311 | (2006.01) | |

(52) U.S. Cl.
CPC ...... *H01L 21/0271* (2013.01); *C08F 293/005* (2013.01); *C09D 5/00* (2013.01); *C09D 153/00* (2013.01); *H01L 21/02118* (2013.01); *H01L 21/31058* (2013.01); *H01L 21/31138* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 9,005,877 B2 | 4/2015 | Rathsack et al. | |
| 9,120,117 B2 | 9/2015 | Ellison et al. | |
| 9,377,684 B2 * | 6/2016 | Aissou | B82Y 30/00 |
| 2013/0022785 A1 | 1/2013 | Ellison et al. | |
| 2014/0370718 A1* | 12/2014 | Chakrapani | H01L 21/67103 438/725 |
| 2015/0151329 A1* | 6/2015 | Kawanishi | G03F 7/0002 427/553 |
| 2015/0242558 A1* | 8/2015 | Amit | G03F 7/0002 428/195.1 |
| 2015/0329664 A1* | 11/2015 | Cheng | C08F 293/00 427/256 |
| 2016/0276149 A1* | 9/2016 | Smith | H01L 21/0271 |

(Continued)

*Primary Examiner* — Shamim Ahmed
(74) *Attorney, Agent, or Firm* — Kim & Stewart LLP (57) ABSTRACT

According to one embodiment, a pattern forming method includes supplying, onto an under layer, a self-organization material including a block copolymer which includes a first polymer and a second polymer, and a third polymer having a molecular structure with oxygen attached to a cyclic structure, wherein the third polymer is bonded to the first polymer, and phase-separating the block copolymer to form a phase-separation pattern on the under layer.

10 Claims, 10 Drawing Sheets

(56) References Cited

U.S. PATENT DOCUMENTS

2016/0291461 A1* 10/2016 Yoshida ................. C08F 297/02
2017/0076952 A1* 3/2017 Kawanishi ........... C09D 153/00
2017/0162380 A1* 6/2017 Cheng ................. H01L 21/0271
2017/0178896 A1* 6/2017 Matsuki ............ H01L 21/31058

* cited by examiner

PATTERN FORMING METHOD, SELF-ORGANIZATION MATERIAL, AND METHOD OF MANUFACTURING SEMICONDUCTOR APPARATUS

CROSS-REFERENCE TO RELATED APPLICATION

This application is based upon and claims the benefit of priority from Japanese Patent Application No. 2016-180778, filed Sep. 15, 2016, the entire contents of which are incorporated herein by reference.

FIELD

Embodiments described herein relate generally to a pattern forming method, a self-organization material, and a method of manufacturing a semiconductor apparatus.

BACKGROUND

In recent years, miniaturization of a semiconductor apparatus has advanced, and lithography techniques have been developed that take advantage of self-organization, or directed self-assembly (DSA) materials that can create a fine hole pattern.

However, there is a problem in that it is hard to form a desired pattern with the DSA material in the related art. Therefore, a DSA material which is capable of forming a desired pattern is desired.

DETAILED DESCRIPTION

Embodiments provide a self-organization material which is capable of forming a desired pattern, and a pattern forming method which can realize a desired pattern by using such a self-organization material and a method for manufacturing a semiconductor apparatus.

In general, according to one embodiment, a pattern forming method includes supplying, onto an under layer, a self-organization material including a block copolymer which includes a first polymer and a second polymer, and a third polymer having a molecular structure with oxygen attached to a cyclic structure, wherein the third polymer is bonded to the first polymer, and phase-separating the block copolymer to form a phase-separation pattern on the under layer.

Hereinafter, the exemplary embodiments will be described with reference to the drawings. The embodiments are not limited to the invention.

First embodiment

FIG. 1A to FIG. 2C are diagrams illustrating a configuration example of a self-organization material (hereinafter, also referred to as a DSA material) according to the first embodiment.

Figure 1A:
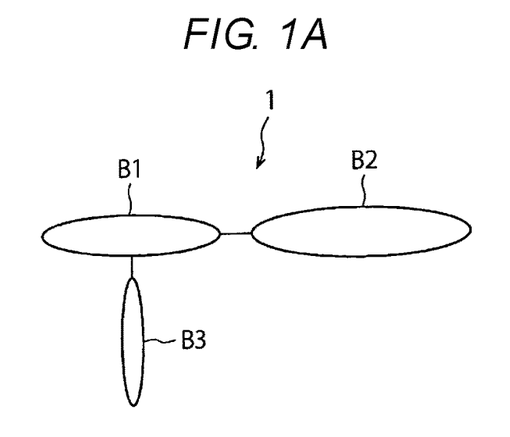
FIGS. 1A to 1C are diagrams illustrating a configuration example of a self-organization material according to a first embodiment.

A DSA material 1 as illustrated in FIG. 1A is provided with a first block B1 as a first polymer, a second block B2 as a second polymer, and a third block B3 as a third polymer (or a fourth polymer). The first block B1 and the second block B2 include a block copolymer as a diblock copolymer. The third block B3 is bonded to the first block B1. In FIG. 1A, one third block B3 is bonded to the first block B1. However, as the DSA material 4 illustrated in FIG. 2A, a plurality of the third blocks B3 may be bonded to the first block B1. In this case, the third block B3 may be bonded to each of the first monomers including the first block B1, as described below.

Figure 1B:
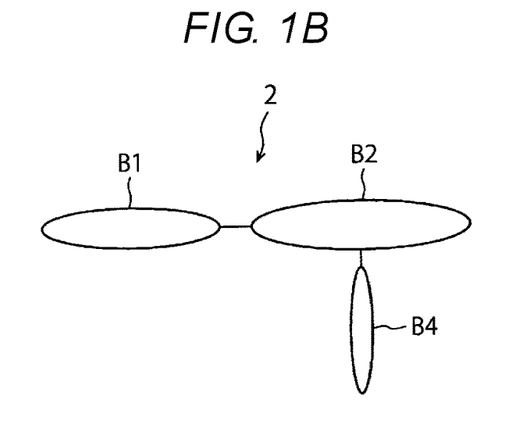

A DSA material 2 as illustrated in FIG. 1B is provided with a first block B1, a second block B2, a fourth block B4 as a fourth polymer (or a third polymer). Similar to the first block B1 and the second block B2 of the DSA material 1, the first block B1 and the second block B2 include a block copolymer as a diblock copolymer. The fourth block B4 is bonded to the second block B2. In FIG. 1B, one fourth block B4 is bonded to the second block B2. However, as the DSA material 5 illustrated in FIG. 2B, a plurality of the fourth blocks B4 may be bonded to the second block B2. In this case, the fourth block B4 may be bonded to each of the second monomers including the second block B2, as described below.

Figure 1C:
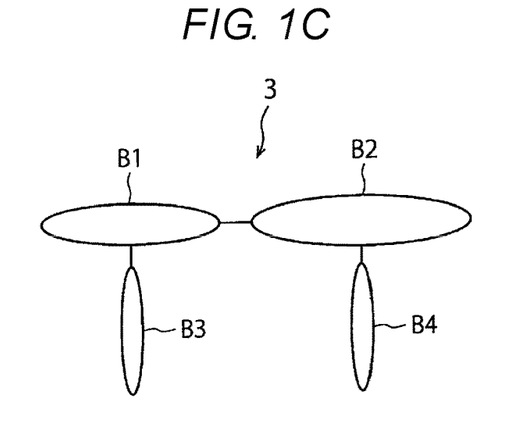

A DSA material 3 as illustrated in FIG. 1C is provided with a first block B1, a second block B2, a third block B3, and a fourth block B4. Similar to the first block B1 and the second block B2 of the DSA material 1, the first block B1 and the second block B2 include a block copolymer as a diblock copolymer. The third and fourth blocks B3 and B4 are respectively bonded to the first and second blocks B1 and B2. In FIG. 1C, the third and fourth blocks B3 and B4 are respectively bonded to the first and second blocks B1 and B2. However, as the DSA material 6 illustrated in FIG. 2C, a plurality of the third blocks B3 and a plurality of the fourth blocks B4 may be bonded to the first and second blocks B1 and B2.

Figure 2A:
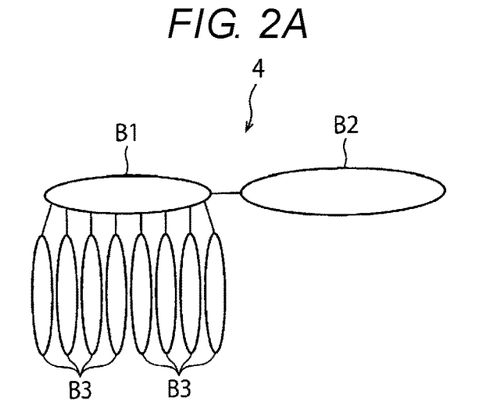
FIGS. 2A to 2C are diagrams illustrating the configuration example of the self-organization material according to the first embodiment.
Figure 3A:
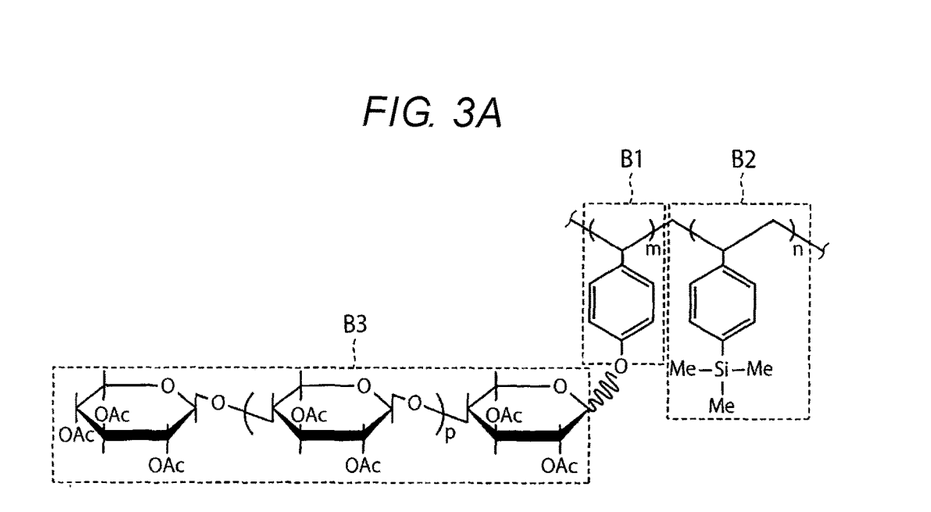
FIGS. 3A and 3B are chemical formulae illustrating more specific configuration examples of some DSA materials.

FIG. 3A is a chemical formula illustrating more specific configuration examples of DSA materials 1 and 4 in FIG. 1A or FIG. 2A. The first block B1 is, for example, polyhydroxystyrene (PHOST). In FIG. 3A, m is an integer equal to or greater than 2. m hydroxystyrenes (HOST) in parentheses are polymerized so as to form PHOST. In this way, PHOST of the first block B1 is formed by polymerizing m HOSTs as the first monomer. In addition, the second block B2 is, for example, polytrimethyl silylstyrene (PTMSS). n is an integer equal to or greater than 2. n trimethyl silylstyrenes (TMSS) in parentheses are polymerized so as to form PTMSS. In this way, PTMSS of the second block B2 is formed by polymerizing n TMSSs as the second monomer. The PHOST of the first block B1 and the PTMSS of the second block B2 are bonded to each other so as to form a diblock copolymer.

Figure 3B:
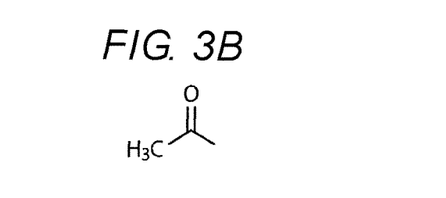

Further, in the embodiment, the third block B3 is bonded to the first block B1. The third block B3 is, for example, a saccharide. The third block B3 may be saccharides such as cellulose, glucose, xylose, and xylan. p is an integer equal to or greater than 2. p xyloses in parentheses are polymerized so as to form xylan. In this way, xylan of the third block B3 is formed by polymerizing p xyloses as the third monomer. Note that, Ac of the third block B3 indicates an acetyl group as illustrated in FIG. 3B.

The third block B3 may be bonded to any one of m first monomers (HOST). For example, in a case where the third block B3 is bonded to one of the first monomers (HOST), the DSA material is formed as illustrated in FIG. 1A. For example, in a case where the third block B3 is bonded to the plurality of first monomers (HOST), the DSA material is formed as illustrated in FIG. 2A. In addition, the third block B3 may be bonded to all of the m first monomers (HOST). That is, the third block B3 may be bonded to at least one, optionally 1 to m, first monomers (HOST) among the m first monomers (HOST).

Figure 2B:
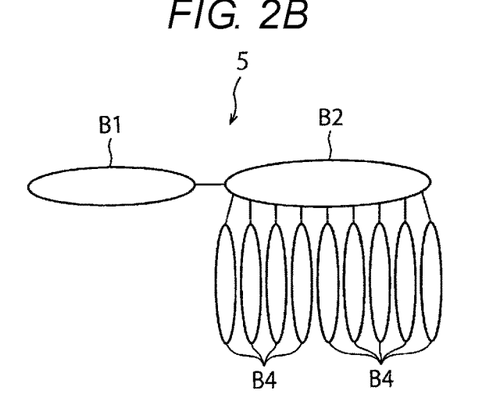
Figure 2C:
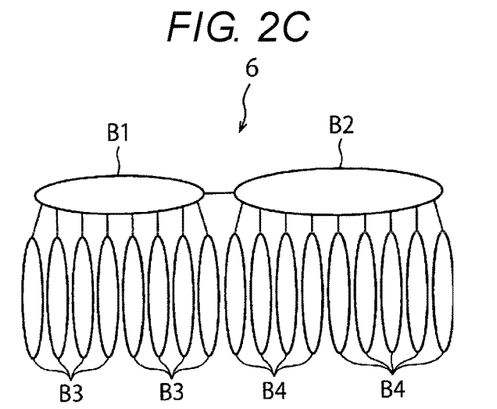
Figure 4:
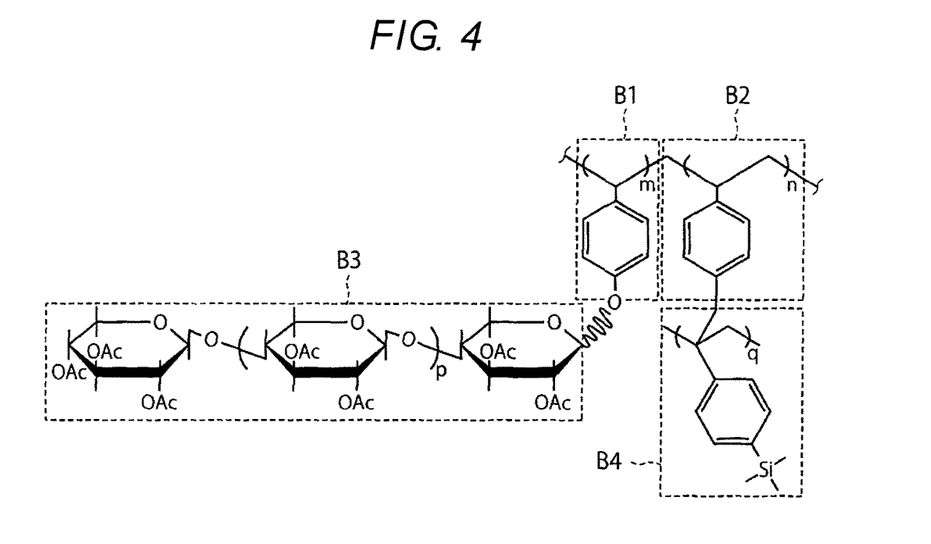
FIG. 4 is a chemical formula illustrating more specific configuration examples of additional DSA materials.

FIG. 4 is a chemical formula illustrating more specific configuration examples of DSA materials 3 and 6 in FIG. 1C or FIG. 2C. The first and third blocks B1 and B3 are the same as the first and third blocks B1 and B3 in the above-described FIG. 3A. Accordingly, the first block B1 is, for example, polyhydroxystyrene (PHOST). In addition, the third block B3 is, for example, a saccharide. The third block B3 may be a saccharide, for example, such as xylose, xylan in addition to cellulose and glucose.

The second block B2 is, for example, polystyrene (PS). n is an integer equal to or greater than 2. n styrenes in parentheses are polymerized so as to form PS. In this way, PS of the second block B2 is formed by polymerizing n styrenes as the second monomer. PHOST of the first block B1 and PS of the second block B2 are bonded to each other so as to form a diblock copolymer.

Further, in the embodiment, the fourth block B4 is bonded to the second block B2. The fourth block B4 is, for example, polytrimethyl silylstyrene (PTMSS). The variable q represents an integer equal to or greater than 2. In the embodiment, q trimethyl silylstyrenes (TMSS) in parentheses are polymerized so as to form PTMSS. In this way, PTMSS of the fourth block B4 is formed by polymerizing q trimethyl silylstyrenes (TMSS) as the fourth monomer.

The polymer of block B4 may be synthesized using a living anionic polymerization method. Trimethylsilylstyrene (TMSS) monomer, butyllithium, and tetrahydrofuran are polymerized by living anionic polymerization at a synthesis temperature of −75 deg to yield Polytrimethylsilylstyrene (PTMSS). The resulting polymer (block B4) can then be linked to the B3-B1-B2 block copolymer by bromine radical crosslinking. The block B4 polymer can be exposed to HBr gas in a vacuum chamber, and then the B3-B1-B2 block copolymer added and mixed to link to the block B4 polymer.

The fourth block B4 may be bonded to one or more of n second monomers (styrene). For example, in a case where the fourth block B4 is bonded to one second monomer (styrene), the DSA material is formed as illustrated in FIG. 1C. For example, in a case where the fourth block B4 is boned to the plurality of second monomers (styrene), the DSA material is formed as illustrated in FIG. 2C. In addition, the fourth block B4 may be bonded to all of the n second monomers (styrene). That is, the fourth block B4 maybe bonded to, at least one, optionally 1 to n, second monomers (styrene) among the n second monomers (styrene).

Note that, if the third block B3 in FIG. 4 is omitted, DSA materials 2 and 5 illustrated in FIG. 1B and FIG. 2B can be obtained. Accordingly, here, more specific chemical formulae and description for the DSA materials 2 and 5 illustrated in FIG. 1B and FIG. 2B will be omitted.

Figure 5:
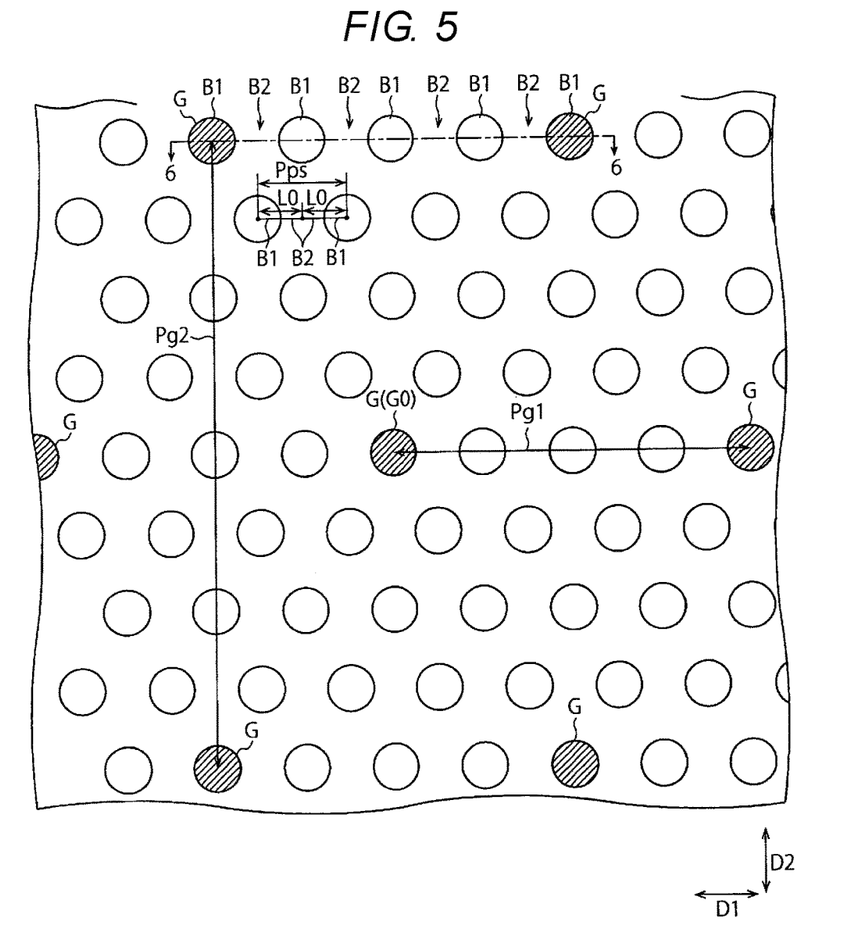
FIG. 5 is a plan view illustrating an example of a pattern which is obtainable when the DSA material is phase-separated according to the first embodiment.
Figure 6:
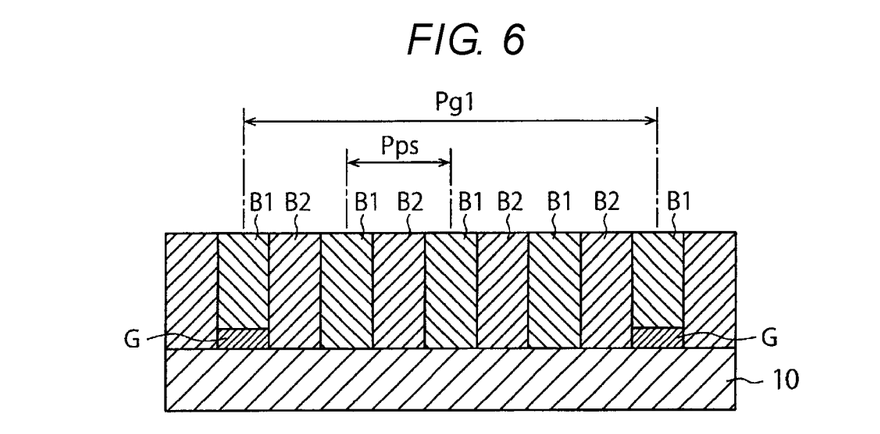
FIG. 6 is a sectional view illustrating an example of a pattern forming method and a method of manufacturing a semiconductor apparatus according to the first embodiment.

FIG. 5 is a plan view illustrating an example of a pattern which is obtainable when the DSA material is phase-separated according to the first embodiment. FIG. 6 is a sectional view taken along section line 6 in FIG. 5. Note that, a guide pattern and a phase-separation pattern illustrated in FIG. 5 and FIG. 6 are merely an example, and thus it is possible to optionally change the phase-separation pattern by changing the guide pattern.

As illustrated in FIG. 6, a guide G is provided on an under layer 10. The under layer 10 is, for example, a material which can be used as a hard mask in the lithography technique such as a silicon oxide film. The guide G is formed by processing the under layer 10, and is formed by using the same material as that of the under layer 10. Certainly, the guide G may be formed of a material different from that of the under layer 10.

As illustrated in FIG. 5, the guides G are disposed in a matrix pattern on the under layer 10 so as to be arranged in a first direction D1 and a second direction D2. The second direction D2 is a direction orthogonal to the first direction D1. For example, the guides G are arranged to be shifted by ½ of guide pitches Pg1 and Pg2 in the direction D1 and the direction D2. The guide pitch Pg1 is a distance between the center of a certain guide G and the center of a guide G which is adjacent to the certain guide G in the direction D1. The guide pitch Pg2 is a distance between the center of a certain guide G and the center of a guide G which is adjacent to the certain guide G in the direction D2. With this, six guides G are almost equidistantly adjacent to each other around one guide (for example, G0). A planar shape in which the center points of the six guides G are connected by a straight line becomes a substantially regular hexagon. That is, the guide G is a hexagonal arrangement pattern.

When the DSA material is phase-separated by using the guide G, the plurality of first and second blocks B1 and B2 are regularly arranged between the adjacent guides G as illustrated in FIGS. 5 and 6. At this time, a cylindrical pattern of the first block B1 which is phase-separated also becomes a hexagon arrangement pattern. That is, six cylindrical patterns of the first block B1 are adjacent to each other around one cylindrical pattern of the first block B1 at almost equidistant (Pps). When a length of one block copolymer containing one first block B1 and one second block B2 is set to as L0, the distance between centers of circles of two adjacent first blocks B1 (hereinafter, also referred to as phase-separation pitch Pps) illustrated in FIG. 5 becomes 2×L0. In the embodiment, the distance (the guide pitch Pg1) between a certain guide G0 and six guides G which are adjacent to the certain guide G0 corresponds to four phase-separation pitches Pps. That is, when the DSA material is phase-separated, eight block copolymers (B1 and B2) are arranged between the guides G which are adjacent to each other. Note that, as illustrated in FIG. 6, the first blocks B1 are arranged on the guides G.

As described above, when the guide G is properly disposed, the DSA material can form the cylindrical patterns which are regularly arranged due to the phase-separation.

Here, the DSA material according to the embodiment includes a third block B3 and/or a fourth block B4 in addition to the first and second blocks B1 and B2 for forming the block copolymer. With this, the molecular weight of the DSA material can be increased by the molecular weight of the third block B3 and/or the fourth block B4 without increasing the molecular weight of the block copolymer including the first and second blocks B1 and B2.

In order to increase the diameter of the cylindrical pattern, the length L0 of the block copolymer, or the phase-separation pitch Pps in the phase-separation pattern, it is considered to increase the molecular weight of the DSA material. For example, in order to increase the molecular weight of the DSA material, in a case where the molecular weight of the first and second blocks B1 and B2 for forming the block copolymer is increased, since a polymerization reaction is stopped in the way of a phase-separation process, the period of the phase-separation process becomes very long as described above, and thus it is substantially hard to perform the phase-separation on the DSA material. Accordingly, in the DSA material in the related art, for example, it was hard to form a hole pattern having a diameter of approximately equal to or greater than 40 nm. In addition, it was hard to form a hole pattern having a pitch of equal to or greater than 60 nm. On the other hand, for example, with immersion lithography, it was hard to form a fine hole pattern having a diameter of approximately equal to or less than 70 nm from the resolution limit of exposure.

In contrast, in the DSA material according to the embodiment, when the third block B3 and/or fourth block B4 are bonded to the first and second blocks B1 and B2 forming the block copolymer, the molecular weight of the DSA material can be increased without increasing the molecular weight of the block copolymer. As such, when the increase in the molecular weight of the block copolymers (B1 and B2) is suppressed, the polymerization reaction proceeds without being stopped in the way in the phase-separation process. Accordingly, the phase-separation process can be carried out in a short time.

Further, when the third block B3 and/or fourth block B4 are bonded to the block copolymers (B1 and B2), the molecular weight of the entire DSA materials is increased. The third block B3 or the fourth block B4 has a function of increasing the diameter of the cylindrical pattern, the length L0 of the block copolymer, or the phase-separation pitch Pps. That is, the third block B3 or the fourth block B4 serves as a wide range block. With this, the DSA material according to the embodiment can form a desired phase-separation pattern. For example, in a case of using the DSA material illustrated in FIG. 3 or 4, the diameter of the cylindrical pattern is in a range of approximately 40 to 60 nm, and the phase-separation pitch Pps is in a range of approximately 70 to 100 nm. Note that, the test results will be described later. As such, the DSA material according to the embodiment is capable of forming a hole pattern having a desired size which is hardly formed with the DSA material and the immersion lithography in the related art.

Next, a pattern forming method using the DSA material according to the embodiment and a method of manufacturing a semiconductor apparatus will be described.

FIGS. 7A to 7E are sectional views illustrating an example of the pattern forming method and the method of manufacturing a semiconductor apparatus according to the first embodiment. The pattern forming method and the method of manufacturing a semiconductor apparatus according to the embodiment can be applied to a process of laminating material of a laminated memory (3D memory) provided on a semiconductor substrate. Here, the laminating material is not shown in the drawings.

Figure 7A:
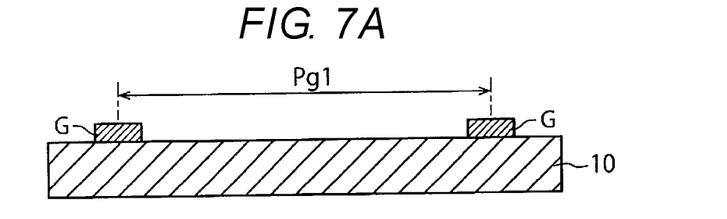
FIGS. 7A to 7E are sectional views illustrating an example of a pattern forming method and a method of manufacturing a semiconductor apparatus according to the first embodiment.

First, as illustrated in FIG. 7A, the guide G is formed on the under layer 10. The under layer 10 is an interlayer insulating film provided on the semiconductor substrate or the laminating material (not shown), and is for example, a mask material such as a silicon oxide film or a silicon nitride film. That is, the under layer 10 is used as a hard mask for processing the laminating material. The guide G is formed by processing the under layer 10 through a lithography technique and an etching technique. Alternatively, the guide G may be formed by processing a guide material which is deposited on the under layer 10. Note that, a planar pattern of the guide G is as described with reference to FIG. 5. Further, a gap (a guide pitch) between the adjacent guides G is set as Pg1.

Figure 7B:
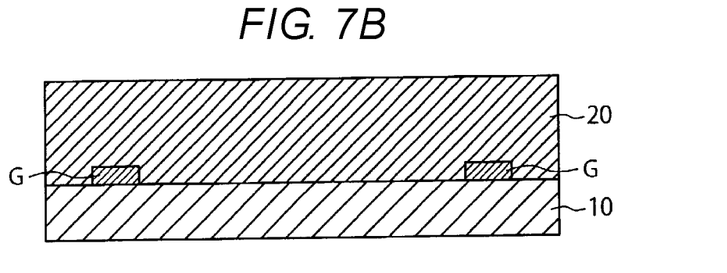

Next, as illustrated in FIG. 7B, the DSA material 20 according to the embodiment is introduced onto the under layer 10. The DSA material 20 is formed by using, for example, a coating technique such as a spin coating method.

Figure 7C:
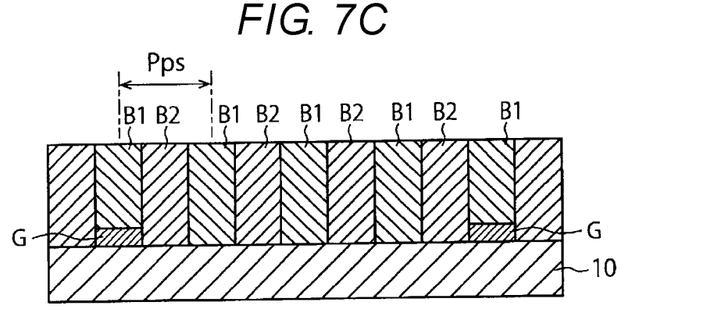

Then, as illustrated in FIG. 7C, a DSA material 20 is phase-separated by an annealing treatment. With this, the DSA material 20 is phase-separated into the first block B1 and the second block B2 so as to form a phase-separation pattern. At this time, as illustrated in FIG. 5, the first block B1 and the second block B2 are phase-separated by the phase-separation pitch Pps. The DSA material includes the third block B3 and/or fourth block B4; however, as described above, the molecular weight of the block copolymers (B1 and B2) are suppressed, and thus the phase-separation process proceeds without being stopped in the way. Further, the third block B3 or the fourth block B4 serves as the wide range block, and thus can form a phase-separation pattern which is larger than the phase-separation pattern of the block copolymer including only the first and second blocks B1 and B2. For example, the DSA material according to the embodiment has a diameter of the cylindrical pattern including the first block B1 which is in a range of approximately 40 to 60 nm, and the phase-separation pitch Pps which is in a range of approximately 70 to 100 nm.

Figure 7D:
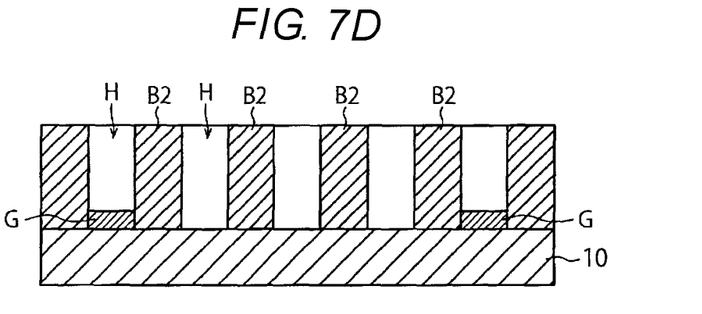

Then, the first block B1 is removed while the second block B2 is left by using the etching technique. With this, as illustrated in FIG. 7D, a hole pattern H is formed.

Subsequently, the under layer 10 is processed by using the second block B2 as a mask through the etching technique. With this, the pattern of the second block B2 is transferred to the under layer 10.

Thereafter, the laminating material (not shown) is processed by using the under layer 10 as a hard mask through the etching technique. With this, it is possible to process the laminating material. For example, a memory hole having almost the same diameter as that of the hole pattern H can be formed in the laminating material.

As described above, in the pattern forming method according to the embodiment, the polymerization reaction is not stopped in the way of the phase-separation process, and thus the phase-separation process can be shortened. Further, the third block B3 or the fourth block B4 serves as a wide range block, and thus it is possible to form relatively large phase-separation pattern.

In the first embodiment, the first block B1 is cylindrically phase-separated, and when the first block B1 is removed, the hole pattern is formed by using the second block B2. In contrast, in a case where the second block B2 is cylindrically phase-separated, when the second block B2 is removed, the hole pattern may be formed by using the first block B1.

Second embodiment

Figure 8:
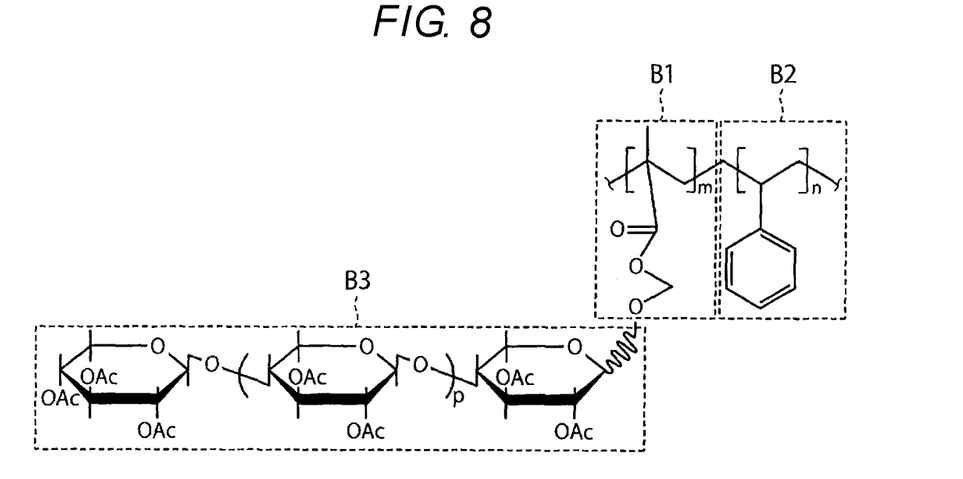
FIG. 8 is a chemical formula illustrating a configuration example of a DSA material according to a second embodiment.

FIG. 8 is a chemical formula illustrating a configuration example of a DSA material according to a second embodiment. The DSA material in FIG. 8 corresponds to the DSA materials 1 and 4 in FIG. 1A or FIG. 2A.

The first block B1 is, for example, polymethyl methacrylate (PMMA). m methyl methacrylates (MMA) in parentheses are polymerized so as to form PHOST. In this way, the PMMA of the first block B1 is formed by polymerizing m MMAs as the first monomer. In addition, the second block B2 is, for example, polystyrene (PS). n styrenes in parentheses are polymerized so as to form PS. In this way, the PS of the second block B2 is formed by polymerizing n styrenes as the second monomer. The PMMA of the first block B1 and the PS of the second block B2 are bonded to each other so as to form a diblock copolymer. In the embodiment, the second block B2 does not include a trimethylsilyl group and silicon. In addition, the DSA material illustrated in FIG. 8 does not include the fourth block B4.

Further, in the embodiment, the third block B3 is bonded to the first block B1. Similar to the case of the first embodiment, the third block B3 is, for example, a hemicellulose or sugar derivative such as acetyl xylan, or another acetyl sugar. The third block B3 can be bonded to the first block B1, in the embodiment, by reacting the acetyl sugar with PBr in water to form bromo acetyl sugar, which will link to the copolymer of blocks B1 and B2 in the presence of $AgCO_3$ using appropriate solvent.

Figure 9:
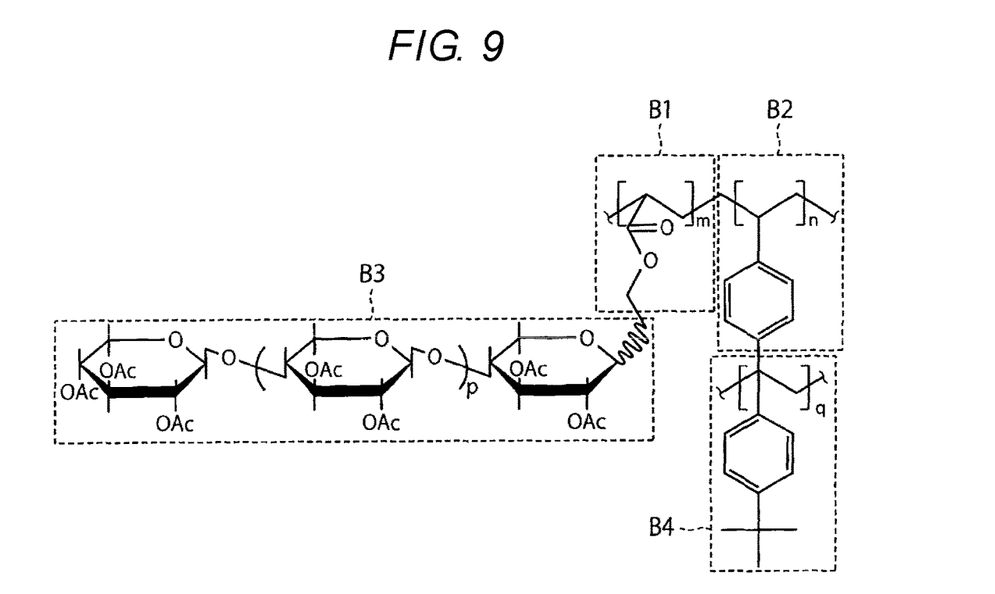
FIG. 9 is a chemical formula illustrating a configuration example of the DSA material according to the second embodiment.

FIG. 9 is a chemical formula illustrating a configuration example of the DSA material according to the second embodiment. The DSA material in FIG. 9 corresponds to the DSA materials 3 and 6 in FIG. 1C or FIG. 2C. The first to third blocks B1 to B3 of the DSA material in FIG. 9 maybe the same as the first to third blocks B1 to B3 of the DSA material in FIG. 8. On the other hand, in the DSA material in FIG. 9, the fourth block B4 is bonded to the second block B2 by bromine radical crosslinking, as described above. The fourth block B4 is, for example, poly-tertiary-butylstyrene (PTBS). A number q of tertiary-butyl styrene (TBS) molecules in parentheses are polymerized so as to form PTBS. In this way, the PTBS of the fourth block B4 is formed by polymerizing q tertiary-butyl styrenes (TBS) as the fourth monomer. The fourth block B4 may be bonded to at least 1, optionally 1 to n, second monomers (styrene) among the n second monomers (styrene).

Note that, if the third block B3 in FIG. 9 is omitted, it is possible to obtain the DSA materials 2 and 5 illustrated in FIG. 1B and FIG. 2B. Accordingly, here, more specific chemical formulae and description for the DSA materials 2 and 5 illustrated in FIG. 1B and FIG. 2B will be omitted.

The pattern forming method and the method of manufacturing a semiconductor apparatus according to the second embodiment may be the same as those in the first embodiment.

As described above, also in the DSA material according to the second embodiment, the molecular weight of the DSA material can be increased by bonding the third block B3 and/or the fourth block B4 to the first and second blocks B1 and B2 forming the block copolymer without increasing the molecular weight of the block copolymer. With this, in the second embodiment, it is possible to obtain the same effect as that in the first embodiment.

In addition, in the second embodiment, the first to fourth blocks B1 to B4 do not contain any one of silicon, a silicon compound, metal, and a metal compound.

Figure 7E:
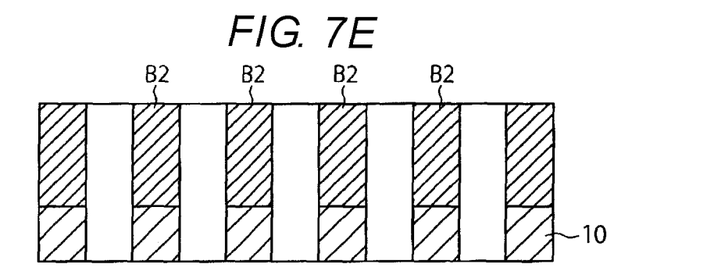

In embodiments wherein the second block B2 contains silicon (see FIG. 3A), and the under layer 10 illustrated in FIG. 7E is a silicon-containing layer such as a silicon oxide film or a silicon nitride film, the etching rate of the under layer 10 becomes slower with respect to the second block B2. In embodiments wherein the second block B2 contains metal, and the under layer 10 illustrated in FIG. 7E is a metal-containing layer, the etching rate of the under layer 10 becomes slower with respect to the second block B2.

In contrast, in the second embodiment, the second block B2 does not contain silicon or metal. Accordingly, when the under layer 10 is a silicon-containing layer or a metal-containing layer, the etching rate of the under layer 10 with respect to the second block B2 can be high.

Third embodiment

Figure 10:
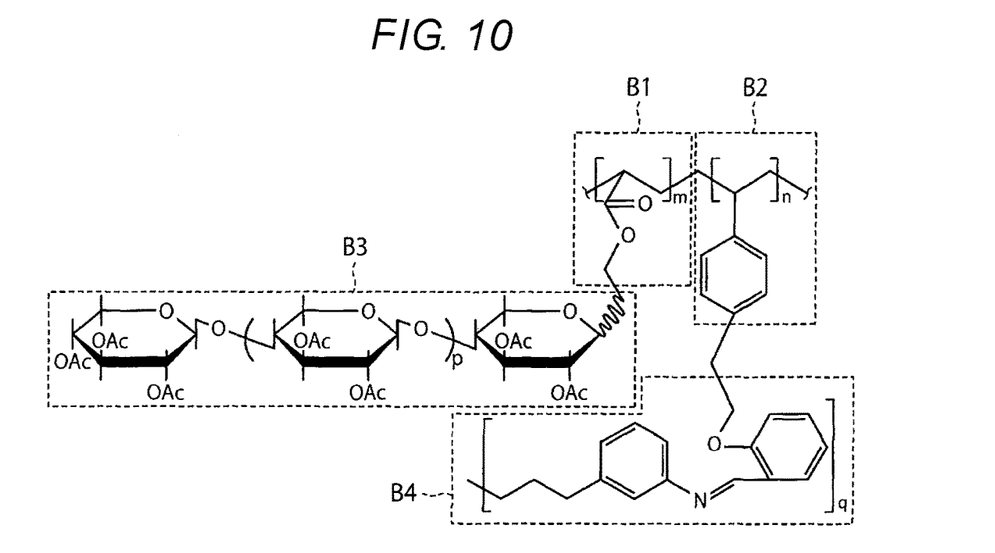
FIG. 10 is a chemical formula illustrating a configuration example of a DSA material according to a third embodiment.

FIG. 10 is a chemical formula illustrating a configuration example of a DSA material according to a third embodiment. The DSA material in FIG. 10 is different from the DSA material in FIG. 9 from the aspect that the fourth block B4 is a liquid-crystal material. The configuration of the first to third blocks B1 to B3 of the DSA material in FIG. 10 maybe the same as the configuration of those of the DSA material in FIG. 9. As the liquid-crystal material, for example, a mesogenic group and the like are used.

The pattern forming method and the method of manufacturing a semiconductor apparatus according to the third embodiment may be the same as those in the first embodiment. As with the other embodiments, the molecular weight of the DSA material is increased, in the third embodiment, by bonding the third block B3 and/or the fourth block B4 to the first and second blocks B1 and B2 forming the block copolymer, without increasing the molecular weight of the block copolymer. In this way, in the third embodiment, it is possible to obtain the same effect as that in the first embodiment.

In addition, similar to the second embodiment, the DSA material according to the third embodiment does not contain any one of silicon, a silicon compound, metal, and a metal compound. Accordingly, in the third embodiment, it is possible to obtain the same effect as that of the second embodiment.

Further, the DSA material according to the third embodiment uses the liquid-crystal material as the fourth block B4. Since the liquid-crystal material has high orientation, even if the thickness of the DSA material is large, the orientability of the liquid-crystal portion facilitates phase-separation of the DSA material. In such cases, a hole pattern H formed as shown in FIG. 7D is deep, and thus it is possible to make the thickness of the second block B2 large. When the thickness of the second block B2 is large, the hole pattern formed on the under layer 10 can be also made deep, and it is possible to form a deep hole pattern in the laminating material under the under layer 10. For example, the DSA material according to the third embodiment is advantageous in a case where it is necessary to form a deep memory hole in the laminated memory.

Modification Example

FIGS. 11 to 17 are chemical formulae illustrating a configuration example of a DSA material according to a number of different modification examples. In addition, Modification Examples of FIGS. 11 to 17 can be also used as anyone of the DSA materials in the first to third embodiments.

Figure 11:
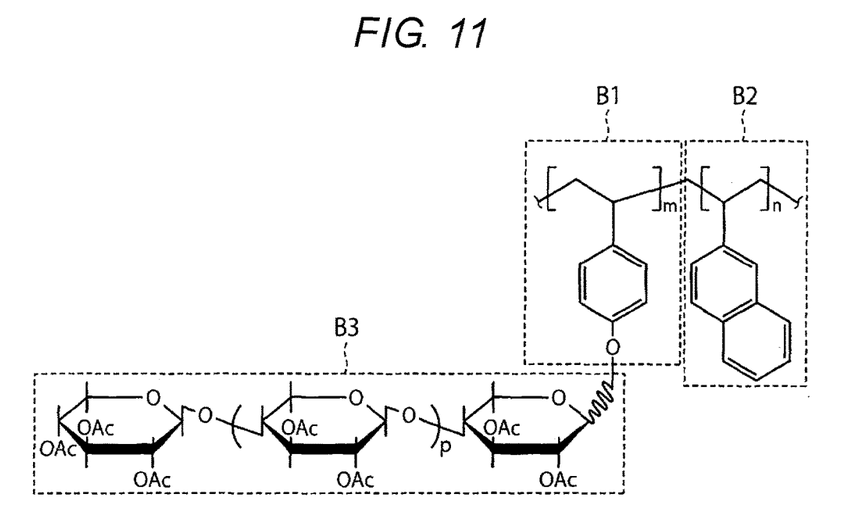
FIGS. 11-17 are each a chemical formula illustrating a configuration example of a DSA material according to different modification examples.

The DSA material in FIG. 11 is different from the DSA material in FIG. 3A from the aspect that the second block B2 is polyvinyl naphthalene (PVN). The configuration of the first and third blocks B1 and B3 of the DSA material in FIG. 10 may be the same as the configuration of those of the DSA material in FIG. 3A.

Figure 12:
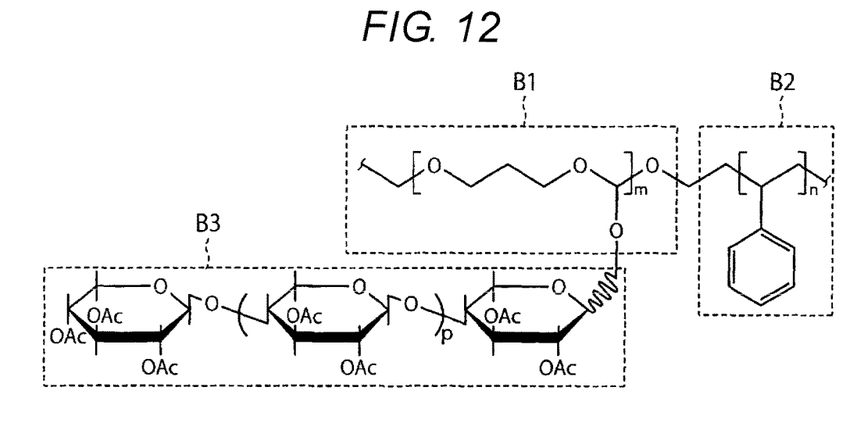

The DSA material in FIG. 12 is different from the DSA material in FIG. 8 from the aspect that the first block B1 is polytrimethylene carbonate (PTMC). The configuration of the second and third blocks B2 and B3 of the DSA material in FIG. 12 may be the same as the configuration of those of the DSA material in FIG. 8.

Figure 13:
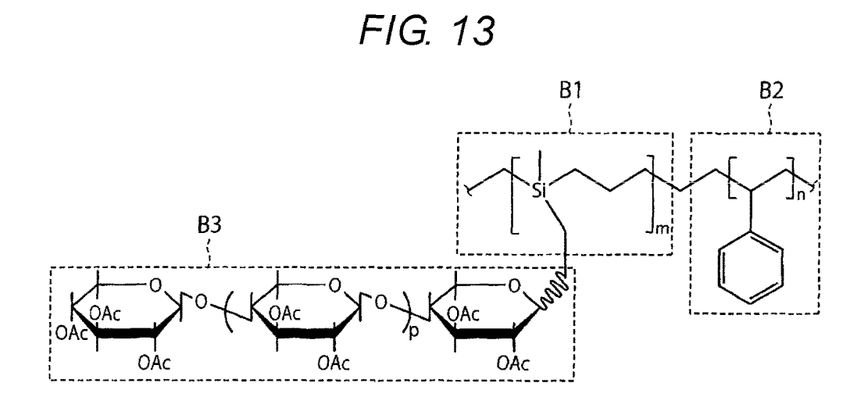

The DSA material in FIG. 13 is different from the DSA material in FIG. 8 from the aspect that the first block B1 is polydimethyl silacyclobutane (PDMSB). The configuration of the second and third blocks B2 and B3 of the DSA material FIG. 13 may be the same as the configuration of those of the DSA material in FIG. 8. The blocks of FIG. 13 may be combined using the reactions described in connection with FIG. 8.

Figure 14:
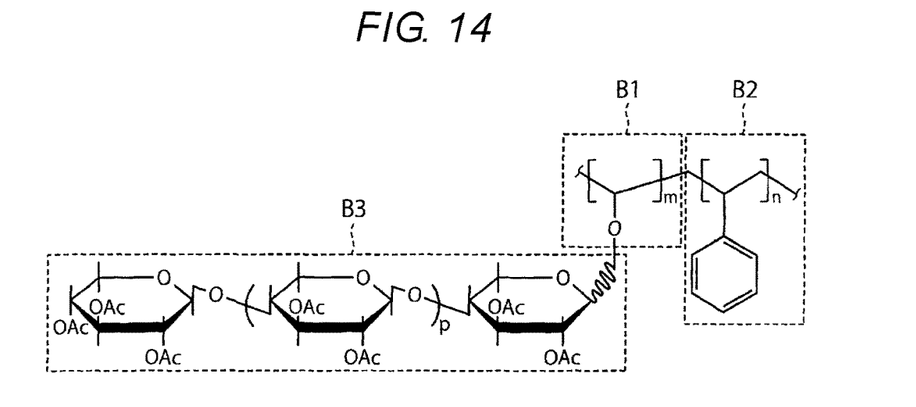

The DSA material in FIG. 14 is different from the DSA material in FIG. 8 from the aspect that the first block B1 is polyvinyl alcohol (PVA). The configuration of the second and third blocks B2 and B3 of the DSA material in FIG. 13 may be the same as the configuration of those of the DSA material in FIG. 8.

Figure 15:
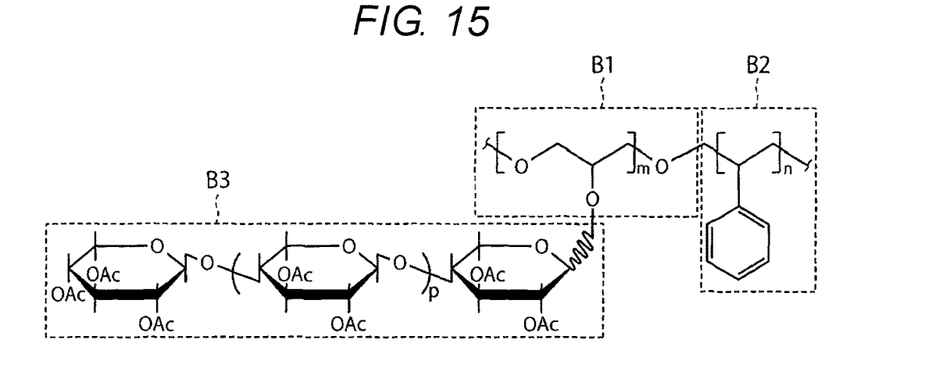

The DSA material in FIG. 15 is different from the DSA material in FIG. 8 from the aspect that the first block B1 is polyglycerol (PG). The configuration of the second and third blocks B2 and B3 of the DSA material in FIG. 15 may be the same as the configuration of those of the DSA material in FIG. 8.

Figure 16:
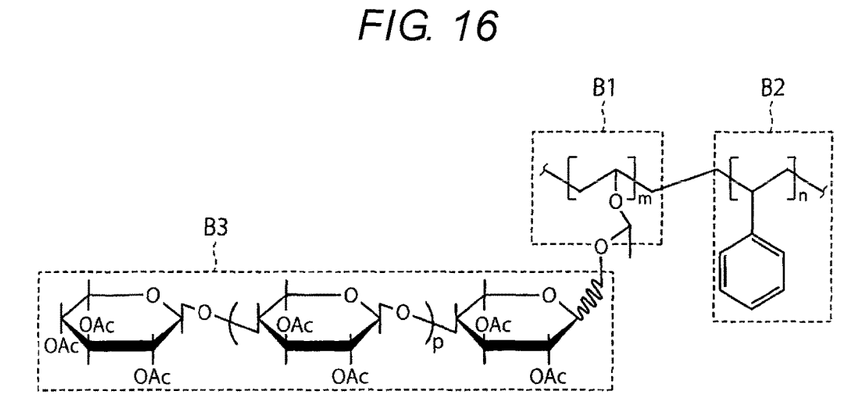

The DSA material in FIG. 16 is different from the DSA material in FIG. 8 from the aspect that the first block B1 (prior to attaching the other two blocks) is polyvinyl acetate (PVAC). Combining PVAC with the second and third blocks B2 and B3 results in the structure shown in FIG. 16. The configuration of the second and third blocks B2 and B3 of the DSA material in FIG. 16 may be the same as the configuration of those of the DSA material in FIG. 8, and the blocks may be combined using the reactions described in connection with FIG. 8.

Figure 17:
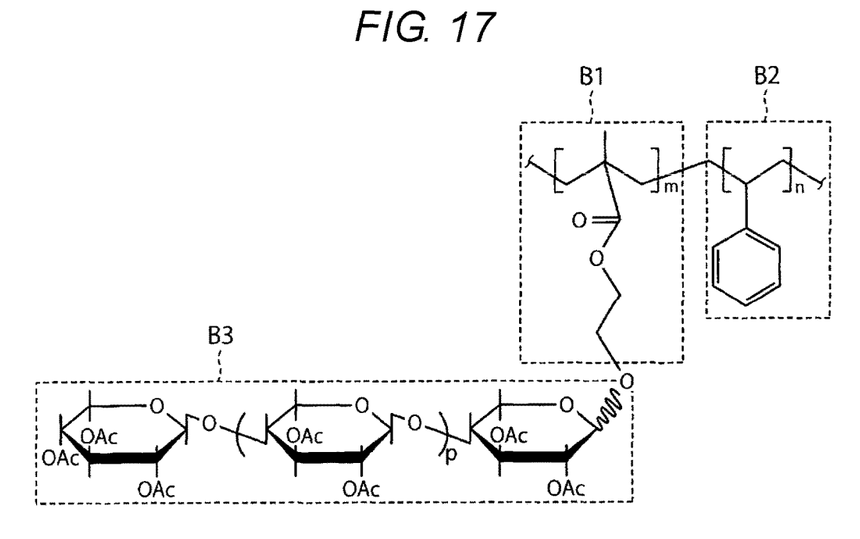

The DSA material in FIG. 17 is different from the DSA material in FIG. 8 from the aspect that the first block B1 is polyhydroxyethyl methacrylate (PHEMA). The configuration of the second and third blocks B2 and B3 of the DSA material in FIG. 17 may be the same as the configuration of those of the DSA material in FIG. 8.

In all of Modification Examples, it is possible to obtain the same effect as that of the first or second embodiment.

Regarding test results

The test results of the first to third embodiments will be described below. Note that, in all of the test results described below, the diameter and the thickness of the cylindrical pattern, and variations of the phase-separation pitches Pps are sufficiently small, and a defect density is also very small.

In each test, a DSA material was dissolved in PGMEA and then spin-coated onto a 300 mm guide-patterned substrate for 30 seconds at varying speeds to yield varying thicknesses of coatings, except where noted otherwise. The substrates were then annealed at 230 degrees for 3 minutes.

In a case of using the DSA material illustrated in FIG. 3A, it was possible to form the cylindrical pattern having a diameter of approximately 40 nm at the phase-separation pitch Pps of approximately 80 nm. At that time, the thickness (depth) of the cylindrical pattern was approximately 50 nm. In addition, it was possible to form the cylindrical pattern having a diameter of approximately 60 nm at the phase-separation pitch Pps of approximately 100 nm. At that time, the thickness of the cylindrical pattern was approximately 90 nm. To form the 50 nm coating, the DSA polymer had Mn of 180,000 and PDI of 1.05, the coating solution was 2 wt % DSA polymer, and the spin speed was 2000 rpm. To form the 90 nm coating, the DSA polymer had Mn of 230,000 and PDI of 1.06, the coating solution was 2 wt % DSA polymer, and the spin speed was 1100 rpm.

In a case of using the DSA material illustrated in FIG. 4, it was possible to form the cylindrical pattern having a diameter of approximately 40 nm at the phase-separation pitch Pps of approximately 70 nm. At that time, the thickness (depth) of the cylindrical pattern was approximately 50 nm. Further, it was possible to form the cylindrical pattern having a diameter of approximately 60 nm at the phase-separation pitch Pps of approximately 100 nm. At that time, the thickness of the cylindrical pattern was approximately 90 nm. To form the 50 nm coating, the DSA polymer had Mn of 170,000 and PDI of 1.05, the coating solution was 2 wt % DSA polymer, and the spin speed was 2000 rpm. To form the 90 nm coating, the DSA polymer had Mn of 220,000 and PDI of 1.05, the coating solution was 2 wt % DSA polymer, and the spin speed was 1100 rpm.

In a case of using the DSA material illustrated in FIG. 8, it was possible to form the cylindrical pattern having a diameter of approximately 40 nm at the phase-separation pitch Pps of approximately 82 nm. At that time, the thickness (depth) of the cylindrical pattern was approximately 60 nm. In addition, it was possible to form the cylindrical pattern having a diameter of approximately 55 nm at the phase-separation pitch Pps of approximately 100 nm. At that time, the thickness of the cylindrical pattern was approximately 95 nm. To form the 60 nm coating, the DSA polymer had Mn of 180,000 and PDI of 1.03, the coating solution was 2 wt % DSA polymer, and the spin speed was 1900 rpm. To form the 95 nm coating, the DSA polymer had Mn of 230,000 and PDI of 1.04, the coating solution was 2 wt % DSA polymer, and the spin speed was 1200 rpm.

In a case of using the DSA material illustrated in FIG. 9, it was possible to form the cylindrical pattern having a diameter of approximately 40 nm at the phase-separation pitch Pps of approximately 75 nm. At that time, the thickness (depth) of the cylindrical pattern was approximately 50 nm. In addition, it was possible to form the cylindrical pattern having a diameter of approximately 60 nm at the phase-separation pitch Pps of approximately 120 nm. At that time, the thickness of the cylindrical pattern was approximately 95 nm. To form the 50 nm coating, the DSA polymer had Mn of 160,000 and PDI of 1.03, the coating solution was 2 wt % DSA polymer, and the spin speed was 2000 rpm. To form the 95 nm coating, the DSA polymer had Mn of 200,000 and PDI of 1.04, the coating solution was 2 wt % DSA polymer, and the spin speed was 1000 rpm.

In a case of using the DSA material illustrated in FIG. 10, it was possible to form the cylindrical pattern having a diameter of approximately 40 nm at the phase-separation pitch Pps of approximately 80 nm. At that time, the thickness (depth) of the cylindrical pattern was approximately 1000 nm. In addition, it was possible to form the cylindrical pattern having a diameter of approximately 60 nm at the phase-separation pitch Pps of approximately 100 nm. At that time, the thickness of the cylindrical pattern was approximately 1800 nm. To form the 1000 nm coating, the DSA polymer had Mn of 170,000 and PDI of 1.03, the coating solution was 8 wt % DSA polymer, and the spin speed was 2000 rpm. To form the 1800 nm coating, the DSA polymer had Mn of 220,000 and PDI of 1.04, the coating solution was 8 wt % DSA polymer, and the spin speed was 1000 rpm. In these two examples, the DSA polymer was dissolved in anisole.

Note that, it was found that in the DSA material according to the embodiment, the cylindrical pattern having a relatively small diameter can be sufficiently formed.

For example, in a case of using the DSA material illustrated in FIG. 3A, it was possible to form the cylindrical pattern having a diameter of approximately 8 nm at the phase-separation pitch Pps of approximately 30 nm. At that time, the thickness of the cylindrical pattern was approximately 20 nm. To form the 20 nm coating, the DSA polymer had Mn of 90,000 and PDI of 1.02, the coating solution was 1 wt % DSA polymer, and the spin speed was 2000 rpm.

In a case of using the DSA material illustrated in FIG. 4, it was possible to form the cylindrical pattern having a diameter of approximately 5 nm at the phase-separation pitch Pps of approximately 10 nm. At that time, the thickness of the cylindrical pattern was approximately 15 nm. To form the 15 nm coating, the DSA polymer had Mn of 50,000 and PDI of 1.01, the coating solution was 1 wt % DSA polymer, and the spin speed was 2200 rpm.

In a case of using the DSA material illustrated in FIG. 8, it was possible to form the cylindrical pattern having a diameter of approximately 7 nm at the phase-separation pitch Pps of approximately 30 nm. At that time, the thickness of the cylindrical pattern was approximately 18 nm. To form the 18 nm coating, the DSA polymer had Mn of 90,000 and PDI of 1.02, the coating solution was 1 wt % DSA polymer, and the spin speed was 2100 rpm.

In a case of using the DSA material illustrated in FIG. 9, it was possible to form the cylindrical pattern having a diameter of approximately 4 nm at the phase-separation pitch Pps of approximately 9 nm. At that time, the thickness of the cylindrical pattern was approximately 12 nm. To form the 12 nm coating, the DSA polymer had Mn of 90,000 and PDI of 1.02, the coating solution was 1 wt % DSA polymer, and the spin speed was 2200 rpm. In this example, the DSA polymer was dissolved in anisole.

In a case of using the DSA material illustrated in FIG. 10, it was possible to form the cylindrical pattern having a diameter of approximately 4 nm at the phase-separation pitch Pps of approximately 8 nm. At that time, the thickness of the cylindrical pattern was approximately 500 nm. To form the 500 nm coating, the DSA polymer had Mn of 60,000 and PDI of 1.02, the coating solution was 6 wt % DSA polymer, and the spin speed was 2000 rpm. In this example, the DSA polymer was dissolved in anisole.

As such, in the DSA material according to the embodiment, it is possible to form the hole pattern having a relatively small diameter (for example, approximately several nm) to the hole pattern having a relatively large diameter (for example, in a range of approximately 40 nm to 60 nm).

Molecular Structure of First To Fourth Blocks B1 To B4

As a molecular structure of the first to fourth blocks B1 to B4, the following molecular structures including those described in the above embodiments can be considered.

Examples of the first block B1 may include polymethyl methacrylate, polyvinyl alcohol, polytrimethylene carbonate, polydimethyl disilane, polydimethyl silacyclobutane, polyglycerol, polyvinyl acetate, polyhydroxymethyl methacrylate, polyethyl methacrylate, polyhydroxyethyl methacrylate, polylactic acid, polyethylene oxide, and polyhydroxystyrene, or adducts thereof after attaching to other blocks.

Examples of the second block B2 may include polystyrene, poly tertiary butyl styrene, polyvinyl naphthalene, and poly tertiary butyl naphthalene, or adducts thereof after attaching to other blocks.

Examples of the third block B3 may include polyethylene glycol, polyethylene oxide, and polyglycolic acid, or adducts thereof after attaching to other blocks. The third block B3 may have a molecular structure, in which oxygen is added to acyclic structure such as cyclic ether, for example, polyfuran, polytetrahydrofuran, polyfurfural, polytetrahydropyran, polyfurfuryl alcohol, polypyran, polyisobenzofuran, polybenzodioxole, polybenzaldehyde, polyoxirane, polyoxetane, polydioxane, and polydioxolane.

Further, the third block B3 maybe a molecular structure of a saccharide. In this case, the hydrophilicity of the third block B3 becomes higher, and thus cohesiveness is good. Examples of the sugars may include structures of monosaccharide, disaccharide, trisaccharide, tetrasaccharide, oligosaccharide, and polysaccharide. As the monosaccharide, the third block B3 may be, for example, heptose of a 7-carbon sugar, hexose of 6-carbon sugar, pentose of 5-carbon sugar, tetrose of 4-carbon sugar, and triose of 3-carbon sugar. Examples of the hexose may include psicose, fructose, tagatose, glucose, altrose, mannose, galactose, and idose. Examples of the pentose may include ribose, lyxose, xylose, arabinose, apiose, ribulose, and xylulose. Examples of the tetroses may include erythrose, threose, and erythrulose. Examples of the triose may include glyceraldehyde and dihydroxyacetone.

As the disaccharide, the third block B3 may be, for example, trehalose, isotrehalose, cordbiose, sophorose, nigerose, lamina livaose, maltose, cellobiose, isomaltose, gentiobiose, sucrose, lactose, and turanose.

As the trisaccharide, the third block B3 may be, for example, raffinose, melezitose, and maltotriose.

As the tetrasaccharide, the third block B3 may be, for example, acarbose and stachyose.

As the oligosaccharide, the third block B3 may be, for example, xylooligosaccharide and xylan.

As the polysaccharide, the third block B3 may be, for example, starch, amylose, amylopeptin, glycogen, cellulose, pectin, and glucomannan. In addition, the third block B3 may be, for example, a cyclic cyclodextrin.

The fourth block B4 may be a liquid-crystal material as described above. The fourth block B4 has, for example, a molecular structure which is polymerized by an alkyl chain, and to which a liquid crystal molecule is added. The liquid crystal molecule is a mesogenic group, and may be biphenyl, terphenyl, azobenzene, Schiffbenzene, and stilbene. In the fourth block B4, the liquid crystal molecule may be polymerized.

As the producing method of the DSA material, the following two ways can be considered.

Producing method 1

The second block B2 is produced by, for example, living anionic polymerization, living radical polymerization, or click reaction. Then, the fourth block B4 is attached to the second block B2 by addition polymerization. Bromine radical crosslinking may be used to attach the fourth block B4, as described above.

Next, the first block B1 is attached to the second block B2 by, for example, living anionic polymerization, living radical polymerization, or click reaction. Then, the third block B3 is attached to the first block B1 by addition polymerization. With this, the DSA material is produced.

Producing method 2

First, the fourth block B4 is attached to the monomer of the second block B2, for example by bromine radical addition using the HBr method described above. With this, a first monomer in which the fourth block B4 and the second block B2 are bonded to each other is obtained. A plurality of the first monomers are polymerized by, for example, living anionic polymerization.

Next, the third block B3 is attached to the monomer of the first block B1 using reactions described above for attaching an acetyl sugar or derivative. With this, a second monomer in which the third block B3 and the first block B1 are bonded to each other is obtained. A plurality of the second monomers are polymerized by, for example, living anionic polymerization. At this time, the first block B1 is boned to the second block B2. With this, the DSA material is produced.

Appendix

A pattern forming method according to the embodiment includes supplying a self-organization material including a block copolymer which includes a first polymer and a second polymer, and a third polymer which is bonded to the first polymer, onto an under layer, and phase-separating the block copolymer to form a phase-separation pattern on the under layer.

The self-organization material may further contain the fourth polymer which is bonded to the second polymer.

The first polymer is formed by polymerizing m first monomers (where m is an integer equal to or greater than 2), and the third polymer may be bonded to at least one, optionally 1 to m, first monomers.

The second polymer is formed by polymerizing n of second monomers (where n is an integer equal to or greater than 2), and the fourth polymer maybe bonded to at least 1, optionally 1 to n, second monomers.

The fourth polymer may not contain silicon.

The phase-separation pattern may be a cylindrical pattern having a diameter in a range of approximately 40 nanometers to 60 nanometers.

The self-organization material according to the embodiment includes a block copolymer containing a first polymer and a second polymer, and a third polymer which is bonded to the first polymer.

The self-organization material according to the embodiment may further include the fourth polymer which is bonded to the second polymer.

The first polymer is formed by polymerizing m first monomers (where m is an integer equal to or greater than 2), and the third polymer maybe bonded to at least 1, optionally 1 to m, first monomers.

The second polymer is formed by polymerizing n of second monomers (where n is an integer equal to or greater than 2), and the fourth polymer maybe bonded to at least 1, optionally 1 to n, second monomers.

The fourth polymer may not contain silicon.

The first polymer may be any one of polymethyl methacrylate, polyvinyl alcohol, polytrimethylene carbonate, polydimethyl disilane, polydimethyl silacyclobutane, polyglycerol, polyvinyl acetate, polyhydroxymethyl methacrylate, polyethyl methacrylate, polyhydroxyethyl methacrylate, polylactic acid, polyethylene oxide, and polyhydroxy styrene, or an adduct thereof after attachment to another block.

The second polymer may be any one of polystyrene, poly tertiary butyl styrene, polyvinyl naphthalene, and poly tertiary butyl naphthalene, or an adduct thereof after attachment to another block.

The third polymer may be anyone of polyethylene glycol, polyethylene oxide, polyglycolic acid, polyfuran, polytetrahydrofuran, polyfurfural, polytetrahydropyran, polyfurfuryl alcohol, polypyran, polyisobenzofuran, polybenzodioxole, polybenzaldehyde, polyoxirane, polyoxetane, polydioxane, polydioxolane, psicose, fructose, tagatose, glucose, altrose, mannose, galactose, idose, ribose, lyxose, xylose, arabinose, apiosose, ribulose, xylulose, erythrose, threose, erythrulose, glyceraldehyde, dihydroxyacetone, trehalose, isotrehalose, cordbiose, sophorose, nigerose, laminarribios, maltose, cellobiose, isomaltose, gentiobiose, sucrose, lactose, turanose, raffinose, melezitose, maltotriose, acarbose, stachyose xylo-oligosaccharide, xylan, starch, amylose, amylopeptin, glycogen, cellulose, pectin, glucomannan, and cyclodextrin, or an adduct thereof after attachment to another block.

The fourth polymer may be any one of poly-tertiary-butylstyrene (PTBS), polytrimethylsilyl styrene (PTMSS), a liquid-crystal material, a mesogenic group, biphenyl, terphenyl, azobenzene, Schiffbenzene, and stilbene.

The method of manufacturing a semiconductor apparatus according to the embodiment includes supplying a self-organization material including a block copolymer which includes a first polymer and a second polymer, and a third polymer which is bonded to the first polymer, onto an under layer, phase-separating the block copolymer to thereby form a phase-separation pattern on the under layer, removing the first or second polymer among the phase-separated block copolymer, and processing the under layer by using the phase-separation pattern as a mask, or an adduct thereof after attachment to another block.

The phase-separation pattern may be a cylindrical pattern having a diameter of approximately 40 nanometers to 60 nanometers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
   supplying, on to an under layer, a self-organization material including a block copolymer which includes a first polymer, a second polymer, and a third polymer, wherein the third polymer is bonded to the first polymer and has a molecular structure including oxygen attached to a cyclic structure; and
   after supplying the self-organization material onto the under layer, phase separating the block copolymer to form a phase-separation pattern on the under layer.

2. The method according to claim 1,
   wherein the self-organization material further includes a fourth polymer which is bonded to the second polymer.

3. The method according to claim 1,
   wherein the first polymer is formed by polymerizing m first monomers, where m is an integer equal to or greater than 2, and
   wherein the third polymer is bonded to at least one of the m first monomers.

4. The method according to claim 2,
wherein the second polymer is formed by polymerizing n second monomers, where n is an integer equal to or greater than 2, and
wherein the fourth polymer is bonded to at least one of the n second monomers.

5. The method according to claim 4,
wherein the fourth polymer does not contain silicon.

6. The method according to claim 2,
wherein the fourth polymer does not contain silicon.

7. The method according to claim 1,
wherein the phase-separation pattern comprises cylindrical blocks having diameters ranging from approximately 40 nanometers to 60 nanometers.

8. The method according to claim 1, wherein the third polymer is a saccharide.

9. A method of manufacturing a semiconductor apparatus comprising:

placing a self-organization material on an under layer, the self-organization material including a block copolymer which includes a first polymer, a second polymer, and a third polymer, the third polymer is bonded to the first polymer and has a molecular structure including oxygen attached to a cyclic structure;

phase separating the block copolymer on the under layer to form a phase-separation pattern;

removing the first polymer or second polymer from the phase-separation pattern; and after removing the first polymer or second polymer from the phase-separation pattern, processing the under layer by using the phase-separation pattern as a mask.

10. The method according to claim 9,
wherein the phase separation pattern comprises cylindrical blocks having diameters ranging from approximately 40 nanometers to 60 nanometers.

* * * * *